United States Patent
Stutzman et al.

(10) Patent No.: US 7,857,646 B2
(45) Date of Patent: Dec. 28, 2010

(54) ELECTRICAL TESTING APPARATUS HAVING MASKED SOCKETS AND ASSOCIATED SYSTEMS AND METHODS

(75) Inventors: A. Jay Stutzman, Boise, ID (US);
Daniel P. Cram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 110 days.

(21) Appl. No.: 12/114,661

(22) Filed: May 2, 2008

(65) Prior Publication Data

US 2009/0273359 A1  Nov. 5, 2009

(51) Int. Cl.
*H01R 11/22* (2006.01)

(52) U.S. Cl. ........................ 439/266; 439/331; 439/526; 439/924.1; 439/70

(58) Field of Classification Search ................ 439/266, 439/330, 331, 70, 924.1, 525, 526
See application file for complete search history.

(56) References Cited

U.S. PATENT DOCUMENTS

| | | | |
|---|---|---|---|
| 4,055,806 A | 10/1977 | Patel | |
| 4,145,620 A | 3/1979 | Dice | |
| 4,567,652 A | 2/1986 | Gussman et al. | |
| 4,689,556 A | 8/1987 | Cedrone | |
| 4,744,462 A | 5/1988 | Houseknecht | |
| 4,782,291 A | 11/1988 | Blandin | |
| 4,799,007 A | 1/1989 | Cook et al. | |
| 4,835,469 A | 5/1989 | Jones et al. | |
| 4,846,703 A * | 7/1989 | Matsuoka et al. | 439/71 |
| 4,884,983 A | 12/1989 | Morrison | |
| 4,897,598 A | 1/1990 | Doemens et al. | |
| 4,922,191 A | 5/1990 | Conover | |
| 4,926,117 A | 5/1990 | Nevill | |
| 4,970,460 A | 11/1990 | Jensen et al. | |
| 4,993,955 A * | 2/1991 | Savant | 439/73 |
| 5,267,395 A | 12/1993 | Jones, Jr. et al. | |
| 5,387,861 A | 2/1995 | Neiderhofer | |
| 5,415,560 A | 5/1995 | Balyasny | |
| 5,447,444 A * | 9/1995 | Matsuoka | 439/266 |
| 5,523,695 A | 6/1996 | Lin | |
| 5,594,356 A | 1/1997 | Turner et al. | |
| 5,739,050 A | 4/1998 | Farnworth | |
| 5,764,071 A | 6/1998 | Chan et al. | |
| 5,815,000 A | 9/1998 | Farnworth et al. | |
| 5,847,572 A | 12/1998 | Iwasaki et al. | |
| 5,885,109 A | 3/1999 | Lee et al. | |

(Continued)

*Primary Examiner*—Tho D Ta
*Assistant Examiner*—Travis Chambers
(74) *Attorney, Agent, or Firm*—Perkins Coie LLP (57) ABSTRACT

An apparatus for forming a temporary electrical connection with a microelectronic component and associated systems and methods are disclosed herein. Embodiments of the apparatus can include a base, a plurality of electrical contacts coupled to the base, and a nest attached to the base. The nest includes a plurality of contact compartments aligned with peripheral leads of the microelectronic component and at least partially covering the contacts. Individual contact compartments are masked to prevent a corresponding contact from electrically contacting the peripheral leads of the microelectronic component. In one embodiment, the masked contact compartments are used as a guide zone to guide individual peripheral leads when the microelectronic component is seated at or unseated from the support surface. In an additional or alternative embodiment, the masked contact compartments are used to selectively isolate contacts, for example, from supply or ground electrical potentials.

12 Claims, 11 Drawing Sheets

U.S. PATENT DOCUMENTS

| | | | |
|---|---|---|---|
| 5,894,218 A | 4/1999 | Farnworth et al. | |
| 5,896,037 A | 4/1999 | Kudla et al. | |
| 5,990,692 A | 11/1999 | Jeong et al. | |
| 5,994,784 A | 11/1999 | Ahmad | |
| RE36,442 E | 12/1999 | Kardos | |
| 6,007,349 A * | 12/1999 | Distefano et al. | 439/71 |
| 6,018,249 A | 1/2000 | Akram et al. | |
| 6,025,728 A | 2/2000 | Hembree et al. | |
| 6,048,744 A | 4/2000 | Corisis et al. | |
| 6,064,194 A | 5/2000 | Farnworth et al. | |
| 6,072,233 A | 6/2000 | Corisis et al. | |
| 6,072,323 A | 6/2000 | Hembree et al. | |
| 6,081,429 A | 6/2000 | Barrett | |
| 6,094,058 A | 7/2000 | Hembree et al. | |
| 6,104,204 A | 8/2000 | Hayama et al. | |
| 6,107,122 A | 8/2000 | Wood et al. | |
| 6,150,717 A | 11/2000 | Wood et al. | |
| 6,163,956 A | 12/2000 | Corisis | |
| 6,188,232 B1 | 2/2001 | Akram et al. | |
| 6,198,172 B1 | 3/2001 | King et al. | |
| 6,208,156 B1 | 3/2001 | Hembree | |
| 6,246,108 B1 | 6/2001 | Corisis et al. | |
| 6,247,629 B1 | 6/2001 | Jacobson et al. | |
| 6,252,772 B1 | 6/2001 | Allen | |
| 6,255,833 B1 | 7/2001 | Akram et al. | |
| 6,285,204 B1 | 9/2001 | Farnworth | |
| 6,294,839 B1 | 9/2001 | Mess et al. | |
| 6,373,273 B2 | 4/2002 | Akram et al. | |
| 6,437,586 B1 | 8/2002 | Robinson | |
| 6,476,629 B1 | 11/2002 | Bjork | |
| 6,525,551 B1 | 2/2003 | Beaman et al. | |
| 6,696,848 B2 | 2/2004 | Robinson | |
| 6,707,309 B2 | 3/2004 | Sato et al. | |
| 6,819,129 B2 | 11/2004 | Kim et al. | |
| 6,979,233 B2 * | 12/2005 | Waters et al. | 439/681 |
| 7,043,388 B2 | 5/2006 | Cram | |
| 7,285,970 B2 | 10/2007 | Robinson | |
| 2002/0016091 A1 | 2/2002 | Perino et al. | |
| 2004/0112142 A1 | 6/2004 | Min et al. | |
| 2005/0134299 A1 | 6/2005 | Cram | |
| 2006/0250150 A1 | 11/2006 | Tunaboylu et al. | |
| 2007/0257688 A1 | 11/2007 | Cram et al. | |
| 2008/0048694 A1 | 2/2008 | Stutzman et al. | |

* cited by examiner

ELECTRICAL TESTING APPARATUS HAVING MASKED SOCKETS AND ASSOCIATED SYSTEMS AND METHODS

TECHNICAL FIELD

The present disclosure is generally related to forming temporary electrical connections with microelectronic components. The present disclosure has particular utility in connection with testing such components but can be used in a variety of other applications as well.

BACKGROUND

The microelectronics industry is highly competitive, and most microelectronics manufacturers are highly sensitive to quality and cost considerations. Most microelectronics manufacturers, therefore, require that suppliers of microelectronic components test performance of each component before shipment to minimize the manufacturer's product losses. Microelectronic components are commonly tested by establishing temporary electrical connections between a test system and electrical terminals at the microelectronic component.

Many test systems typically employ a testing apparatus having a support surface that is lined on one or more sides with electrical contacts. A microelectronic component can be placed on the test surface, and the contacts are collectively urged toward and contacted with the terminals at the microelectronic component. Although convenient for concurrently connecting together multiple sets of contacts and terminals, this technique is limited in that the individual contacts and terminals need to be carefully aligned. If a contact is misaligned, the contact can deliver an improper electrical potential to a terminal; this can cause a testing error and/or damage the internal circuitry of a microelectronic component. In many instances, temporary misalignment occurs when a microelectronic device is being installed or removed from a testing apparatus. For example, if a microelectronic component is not accurately aligned when it is installed or removed from a testing apparatus, one or more of the terminals may inadvertently contact the supply or ground voltages at individual contacts of the testing apparatus.

DETAILED DESCRIPTION

Specific details of several embodiments of the disclosure are described below with reference to systems, apparatus, and methods for establishing temporary contact with microelectronic components (e.g., in electrically testing the microelectronic components). The term "microelectronic component" is used throughout to include a variety of articles of manufacture, including packaged semiconductor dies at least partially housed in a dielectric casing. Such packaged dies, for example, can include electrical leads (e.g., terminals) electrically coupled to one or more individual dies, and the leads are configured to extend outside of the dielectric housing. The term "semiconductor die" can encompass substrates upon which or in which microelectronic devices, micromechanical devices, data storage elements, optics, read/write components, and other features are fabricated. For example, SRAM, DRAM (e.g., DDR/SDRAM), flash memory (e.g., NAND/memory), processors, imagers, and other types of devices can be constructed on semiconductor dies. However, other embodiments can include devices manufactured on other types of substrates (e.g., dielectric or conductive substrates). Many specific details of certain embodiments are set forth in FIGS. 1A-9B and the following text to provide a through understanding of these embodiments. Several other embodiments can have different configurations, components, or processes than those described in this disclosure. A person skilled in the relevant art, therefore, will appreciate that additional embodiments may be practiced without several details of the embodiments shown in FIGS. 1A-9B, or with additional details or features.

Figure 1A:
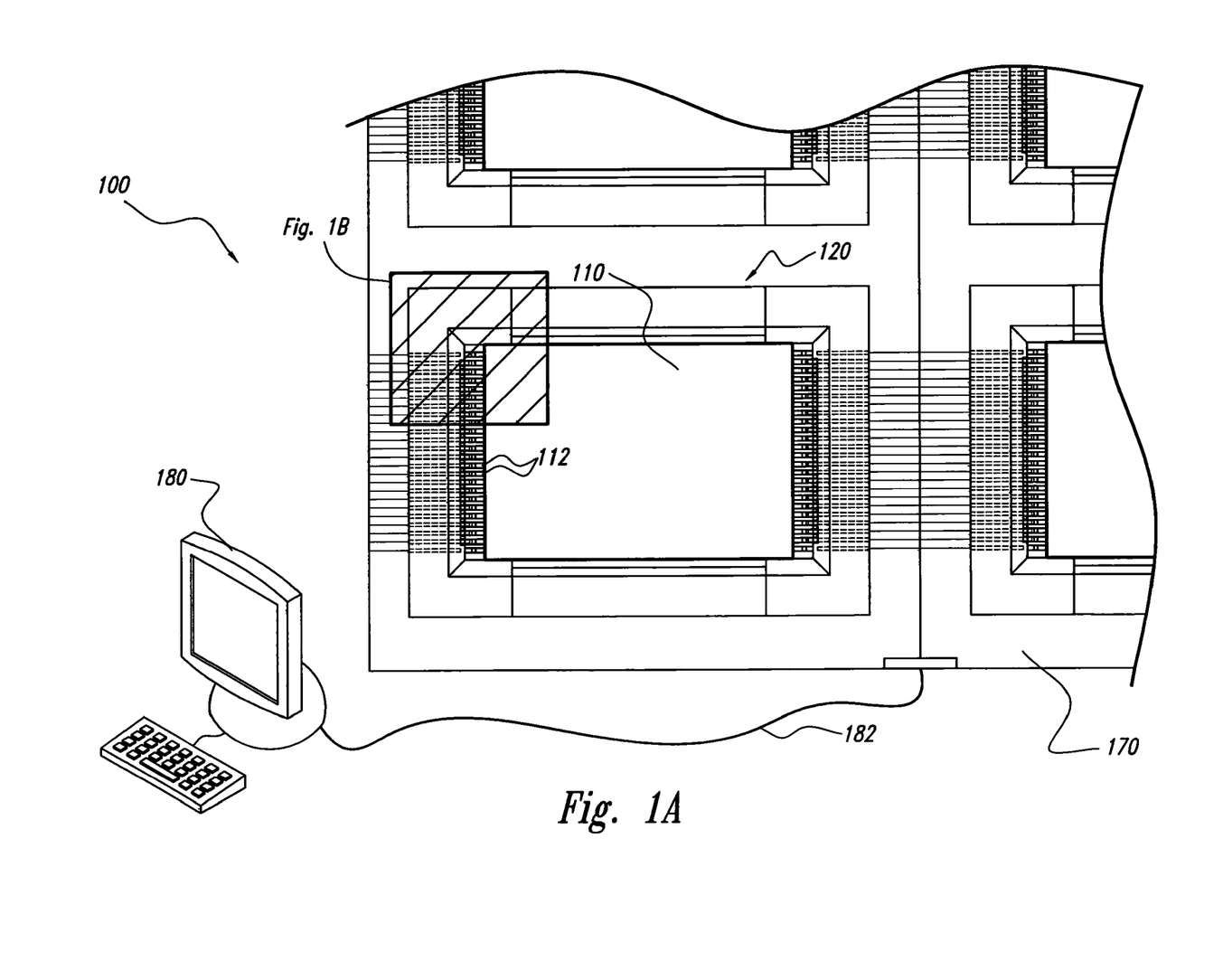
FIGS. 1A and 1B are schematic diagrams of a microelectronic component test system configured in accordance with an embodiment of the disclosure.

FIG. 1A is a schematic diagram illustrating an embodiment of a test system 100 for forming a temporary electrical connection with a microelectronic component 110. For example, the system 100 can electrically contact peripheral leads 112 (e.g. terminals) of the microelectronic component 110. In this embodiment, the system 100 includes an apparatus 120 and an interposer substrate 170 carrying the apparatus 120. In one embodiment, the interposer substrate 170 is a printed circuit board or other type of substrate. The system 100 also includes a computer test station 180 operably coupled with the apparatus 120 via the substrate 170 and a communication link 182 (e.g., a USB cable or a parallel or serial SCSI cable) between the substrate 170 and the test station 180. In many embodiments, the test station 180 can electrically test the microelectronic component 110 by applying a variety of electrical potentials or associated testing processes to the apparatus 120 via the substrate 170 and the communication link 182. For example, the test station 180 can be operably coupled to a plurality of individual apparatus 120, such as in testing applications where a plurality of microelectronic components are tested concurrently. However, in additional or alternative embodiments, the apparatus 120 can be coupled to other electrical devices in addition to or in lieu of the test station 180, such as other microelectronic components attached to the substrate 170 (not shown).

Figure 1B:
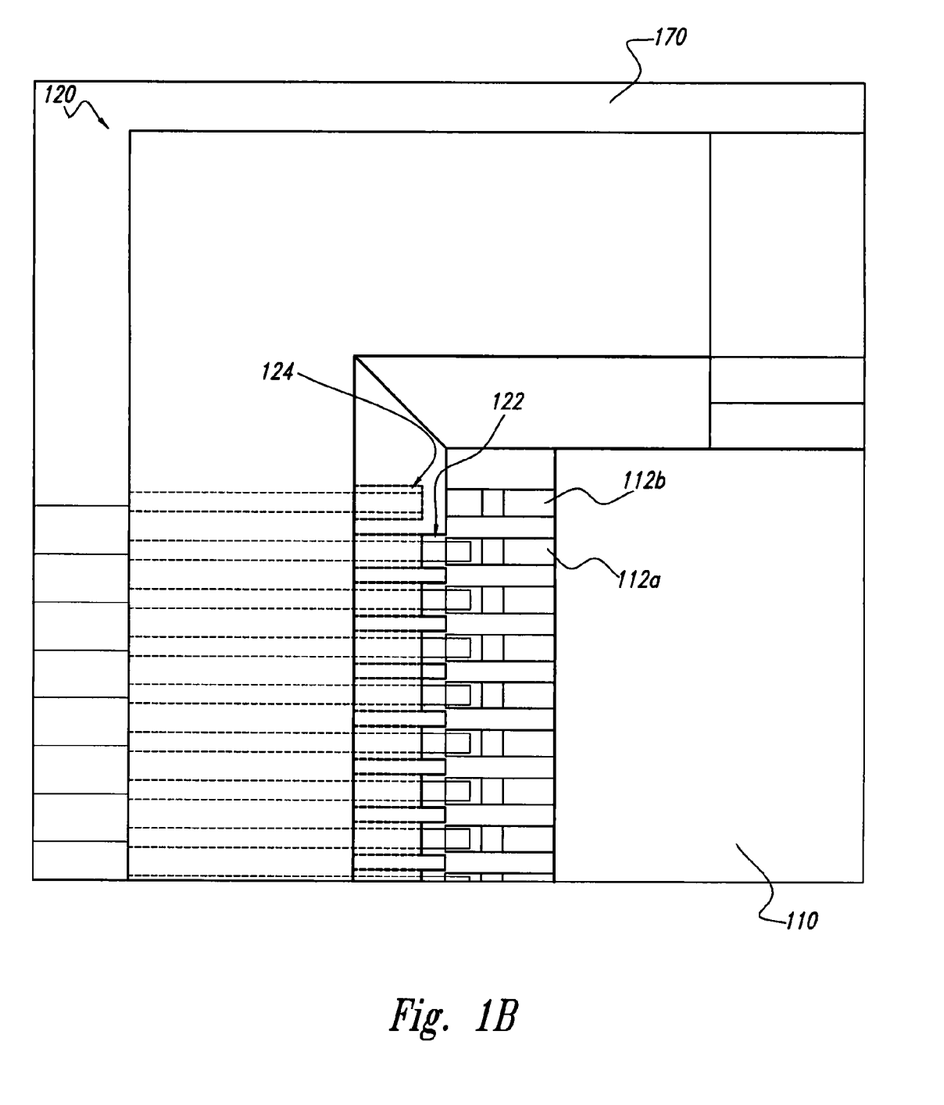

FIG. 1B is a blow-up view of a portion of the system 100 showing the apparatus 120 in more detail. The illustrated example of the apparatus 120 has an unmasked electrical socket 122 and a masked electrical socket 124. An individual lead 112a of the microelectronic component 110 can pass through one of the unmasked electrical sockets 122 and be electrically coupled to the substrate 170. The masked electrical socket 124, on the other hand, electrically isolates another individual peripheral lead 112b from the substrate 170. In several embodiments, the individual lead 112b contacts the masked electrical socket 124 as the microelectronic component 110 is seated within (or unseated from) the apparatus 120. In such embodiments, the masked electrical socket 124 guides the motion of individual leads 112, including the individual lead 112a as described further with reference to FIGS. 5 and 6. In additional and/or alternative embodiments, the masked electrical socket 124 can be employed to selectively isolate the individual lead 112b from the substrate 170 (described further with reference to FIGS. 9A and 9B).

Figure 2:
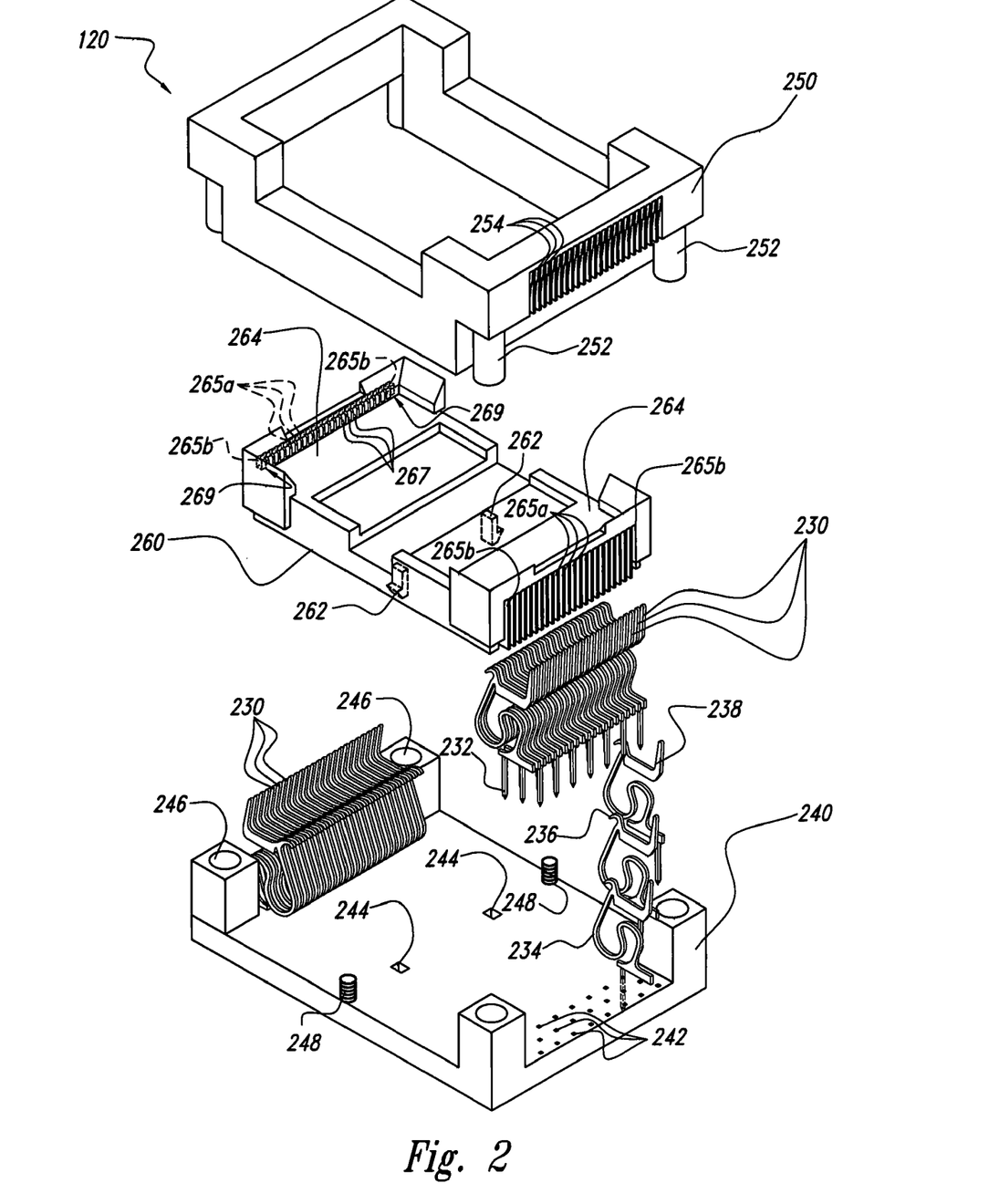
FIG. 2 is a partially exploded isometric view of an apparatus employed in the system of FIGS. 1A and 1B.

FIG. 2 is a partially exploded isometric view of a specific embodiment of the apparatus 120. In this embodiment, the apparatus 120 includes individual electrical contacts 230, a base 240 carrying the contacts 230, an actuator 250 movably coupled to the base 240, and a nest 260 carried by the base 240. Each of the individual contacts 230 can include a pin 232, a spring portion 234, a lateral portion 236, and an arm portion 238. The base 240 can accordingly include a plurality of holes 242 that extend through the base 240 and receive individual pins 232 of corresponding contacts 230 so that the contacts 230 can electrically engage the substrate 170 (FIGS. 1A and 1B). For example, the pins 232 can engage corresponding contact features (e.g., contact pads) at the substrate 170 (not shown). The base 240 can also include tab slots 244 that engage the nest 260, and post slots 246 and spring elements 248 that receive portions of the actuator 250. The actuator 250 includes posts 252 configured to be received in the post slots 246 of the base 240 and individual slots 254 with angled walls to engage the arm portion 238 of individual contacts 230. In operation, the actuator 250 moves up/down to engage/disengage the lateral portion 236 of individual contacts 230 with individual leads 112 of the microelectronic component 110 (FIGS. 1A and 1B). When the angled walls of the slots 254 move downwardly, the arm portion 238 of individual contacts 230 is forced outward (away from the actuator 250); this in turn causes the lateral portion 236 of the individual contacts 230 to move in an outward direction. When the angled walls of the slots 254 move upwardly, the arm portion 238 moves inwardly, and the spring portion 234 of the individual contacts drive the lateral portion 236 of the individual contacts 230 inwardly.

The nest 260, in operation, positions individual leads 112 of the microelectronic component 112 adjacent the lateral portions 232 of the contacts 230 so that individual lateral portions 232 can contact the individual leads 112. The nest 260 can include tabs 262 aligned with the tab slots 244 of the base 240 for locking the nest 260 into the base 240, a support surface 264 for carrying the microelectronic component 110, a plurality of open contact compartments 265a mechanically isolated from one another, and a plurality of closed contact compartments 265b. The open and closed contact compartments 265a and 265b can be aligned with the peripheral leads 112 of the microelectronic component 110 and at least partially cover the contacts 230 when the nest 260 is attached to the base 240. The open contact compartments 265a can include socket openings 267 through which the lateral portion 236 of the individual contacts 230 can extend to contact corresponding peripheral leads 112 of the microelectronic component 110 when the microelectronic component 110 is seated at the support surface 264. The closed contact compartments 265b do not include such openings, but rather the contact compartments 265b have a stop element 269 that inhibits the lateral portion 236 of corresponding contacts 230 from extending above the support surface 264 (described further with reference to FIG. 3B).

Figures 3A, 3B:
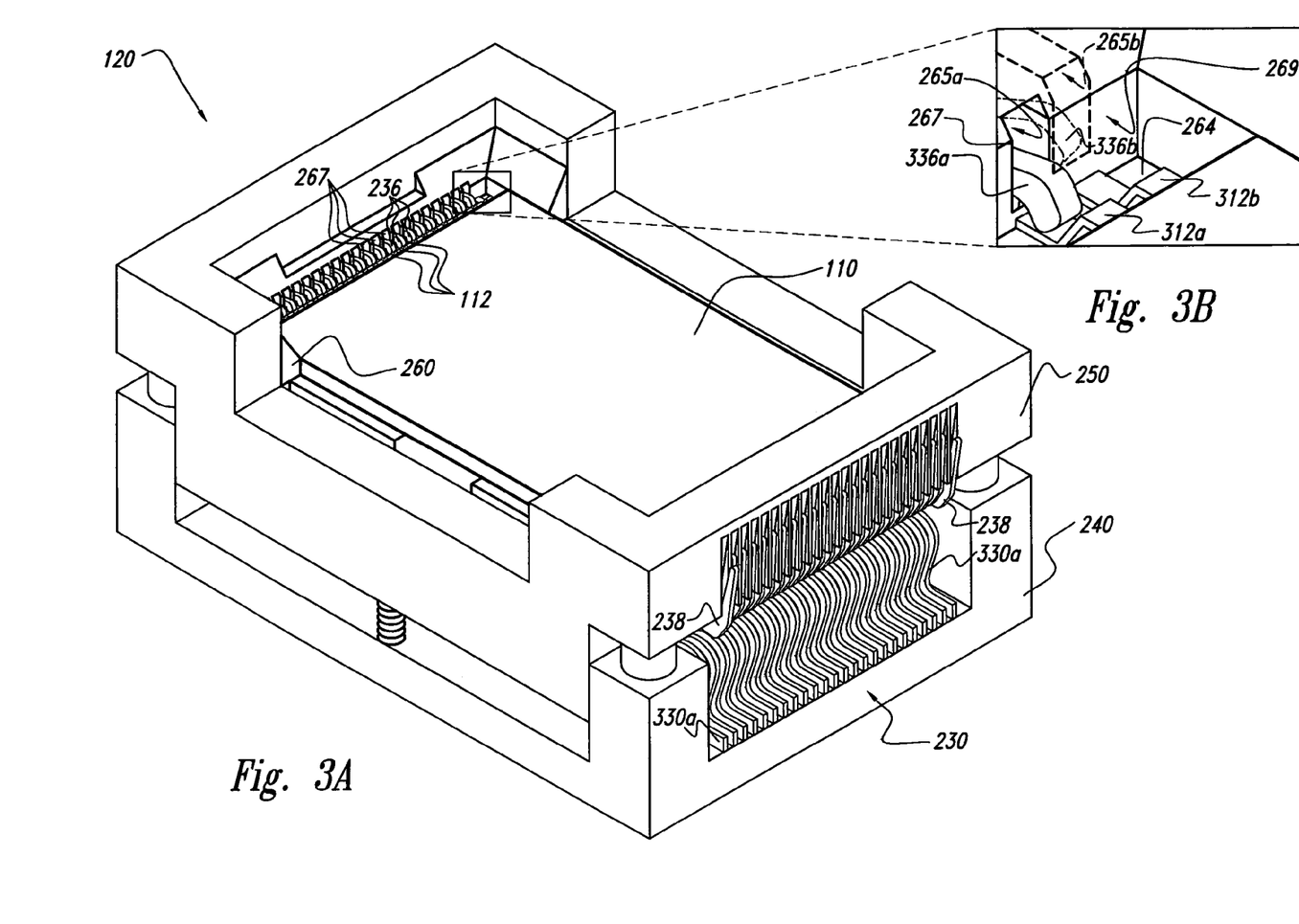
FIGS. 3A and 3B are isometric views of the apparatus of FIG. 2 having an actuator in a raised position.

FIG. 3A is an isometric view of the apparatus 120 with the actuator 250 in a raised position in which the microelectronic component 110 is locked into the nest 260 for testing. In this example, individual lateral portions 236 of the contacts 230 project through individual socket openings 267 of the (unmasked) open contact compartments 265a (FIG. 2). For example, the spring portions 234 (FIG. 2) of the contacts 230 urge the lateral portions 236 laterally and/or vertically towards the individual peripheral leads 112. The individual lateral portions 236, accordingly, can provide electrical contact with the peripheral leads 112 of the microelectronic component 110. Inset FIG. 3B is a blow-up view showing a first lateral contact portion 336a in an open contact compartment 265a extending through an individual socket opening 267 and a second lateral contact portion 336b (drawn in phantom) in an individual closed contact compartment 265b (also drawn in phantom) behind the individual stop element 269. The first lateral contact portion 336a engages a first peripheral lead 312a by positioning a portion of the first peripheral lead 312a between the first lateral contact portion 336a and the support surface 264. The second lateral contact portion 336b, on the other hand, does not engage the second peripheral lead 312b because the stop element 269 blocks the second lateral contact portion 336b from moving inwardly to the second peripheral lead 312b. Referring again to FIG. 3A, masked contacts 330a are located in closed contact compartments 265b such that individual stop elements 269 (not visible in this view) prevent the masked lateral contact portions 336b from moving toward the support surface 264. The arm portions 238 of the contacts 330a, accordingly, project outwardly beyond the arm portions of the other contacts 230 when the actuator is in the raised position.

Figure 4:
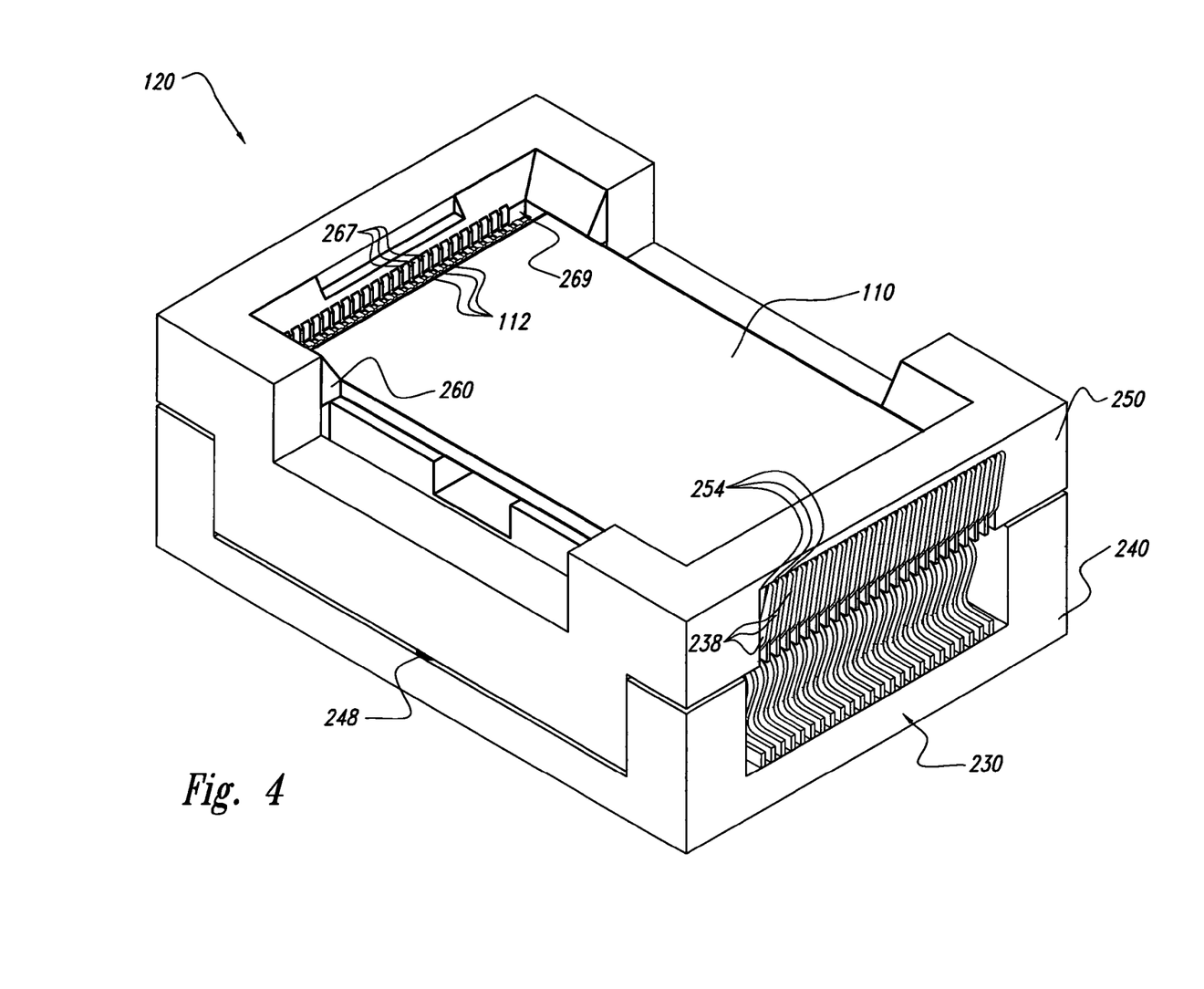
FIG. 4 is an isometric view of the apparatus of FIG. 2 having the actuator in a lowered position.

FIG. 4 is an isometric view of the apparatus 120 with the actuator 250 in a lowered position in which the contacts 230 are disengaged from the peripheral leads 112 for removing/insulating the microelectronic component 110 from/to the apparatus 120. In this example, the angled walls of the slots 254 (FIG. 2) of the actuator 250 engage the arm portions 238 of individual contacts 230 and urge the contacts 230 away from the peripheral leads 112. This causes the lateral contact portions 336 to retract into corresponding socket openings 267. The microelectronic component 110, accordingly, can be seated or unseated from the support surface 264 (FIG. 2) when the contacts 230 are in such a position. A test engineer, for example, can apply a downward force to move the actuator 250 into a lowered position and thereby temporarily retract the contacts 230 into corresponding open contact compartments 265a (FIG. 2). The test engineer can then seat or unseat the microelectronic component 110 at the support surface 264 (FIG. 2). When the downward force is removed, the spring elements 248 drive the actuator 250 upward such that the spring portions 234 urge individual contacts 230 inwardly to contact the peripheral leads 112. However, as described above, the contacts 230 at closed contact compartments 256b are "masked" and cannot engage the peripheral leads because the individual stop elements 269 block the inward movement of the masked lateral portions 336.

Figure 5:
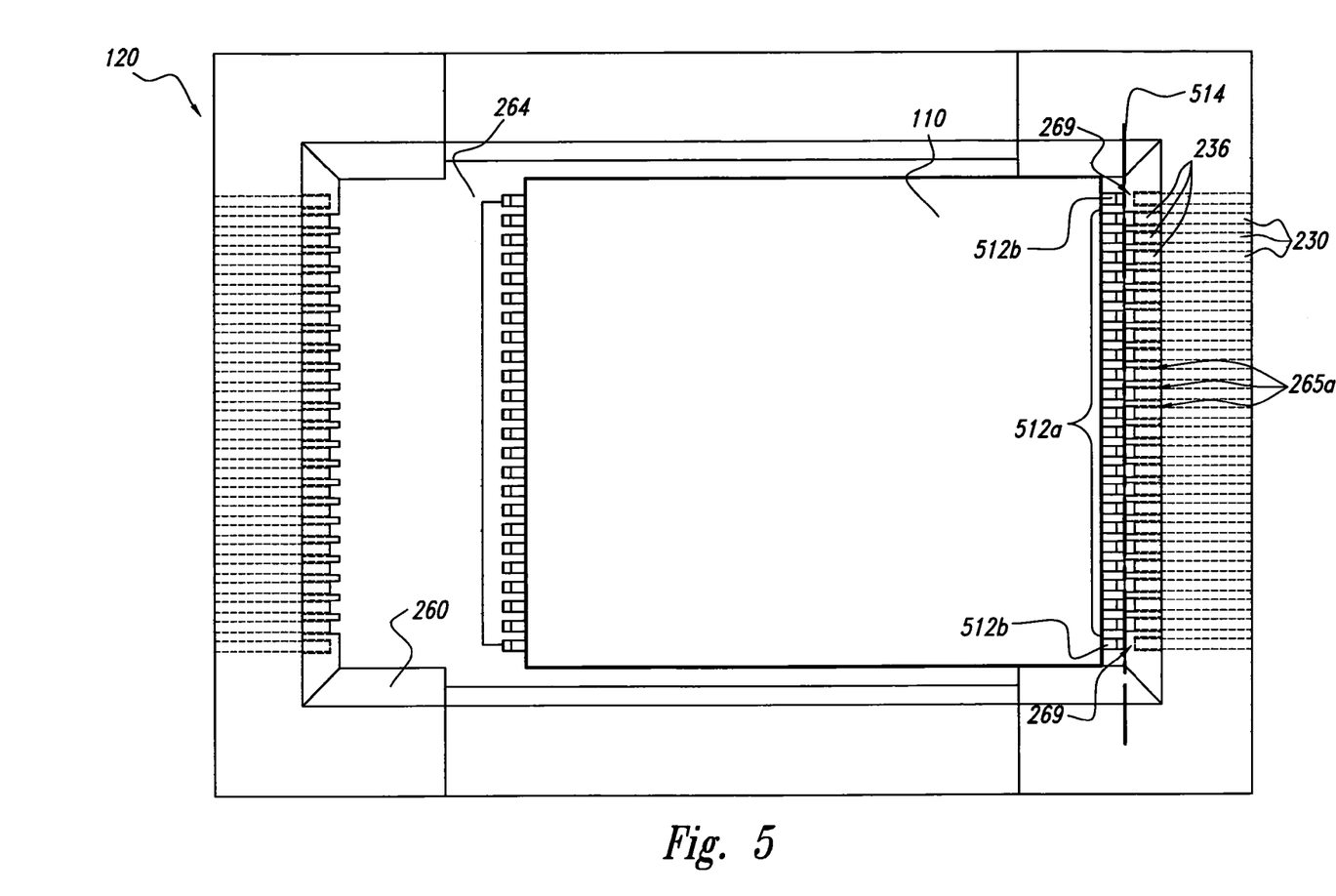
FIG. 5 is a top plan view of the apparatus of FIG. 2 and a microelectronic component being installed or removed from the apparatus.

FIG. 5 is a top plan view of the apparatus 120 showing the microelectronic component 110 and inner and outer peripheral leads 512a and 512b along one edge angled towards the support surface 264 of the nest 260. In several examples, the microelectronic component 110 is angled so that the leads 512a-b along one edge are placed at the support surface 264 while the leads along the other edge are above the support surface 264 when the microelectronic component 110 is being installed at or removed from the nest 260. FIG. 5 also shows the outer leads 512b contacting individual stop elements 269. The individual stop elements 269 defining a guide zone 514 that guides the inner leads 512a as the microelectronic component 110 is seated or unseated from the support surface 264. For example, if the outer leads 512b press against corresponding stop elements 269 (i.e., when the microelectronic component 110 is angled as it is installed/removed), the lateral and/or vertical motion of the inner leads 512a is constrained by the guide zone 514. This can limit the extent to which individual inner leads 512a can project into an individual socket opening 267 of corresponding open contact compartments 265a. The guide zone 514 can also prevent the individual inner leads 512a from contacting the lateral portion 236 of individual leads 230 when the lateral portion is retracted into a corresponding open contact compartment 265a.

In contrast to the apparatus 120, conventional testing apparatus allow the peripheral leads of a microelectronic component to make inadvertent mechanical contact with the contact compartments and/or electrical contacts. For example, if a microelectronic component is angled as it is removed or installed from a conventional testing apparatus, a peripheral lead can be inserted into an interior portion of a socket compartment or make an electrical connection with a contact retracted into the socket compartment. When a lead projects into the socket compartment, it can be difficult to remove a microelectronic component from the testing apparatus. For example, such a lead can inadvertently hook on to the socket opening and create a force that breaks a vacuum seal between the microelectronic component and an automatic tool for installing/uninstalling the microelectronic component within a testing apparatus. When this happens, the microelectronic component needs to be re-positioned or manually removed from the testing apparatus, which ultimately increases the overall testing time of an electrical testing process. Further, when a lead inadvertently makes an electrical connection with the wrong contact, an improper voltage may be delivered to the lead. For example, in electrical testing processes many of the contacts retain an electrical potential even when a microelectronic component is not being tested. Such inadvertent electrical contact can potentially damage an integrated circuit carried by the microelectronic component or corrupt the operation of the integrated circuit.

Embodiments of the apparatus 120, however, employ stop elements to guide the peripheral leads of a microelectronic component as it is removed or installed within the apparatus. Consequently, peripheral leads can be prevented from hooking on to the socket openings or from inadvertently making an electrical connection with a contact. In many embodiments, the stop elements are implemented by masking electrical sockets corresponding to unused leads of a microelectronic component. For example, thin small-outline package (TSOP) Type I and Type II components have leads ranging in number from as few as 20 leads to as many as 66 leads; however, only a subset of these leads are typically needed for the electrical connections with the package. A TSOP Type I component having 24 leads, for example, may only require 20 of the leads for electrical connections. Stop elements can accordingly be formed adjacent the remaining 4 unused leads and can be used to establish guide zones. The guide zones can allow a test engineer or an automated tool to seat and/or unseat a microelectronic component in the apparatus 120 without having peripheral leads hook onto a socket opening or make inadvertent electrical contact with a contact.

Figure 6:
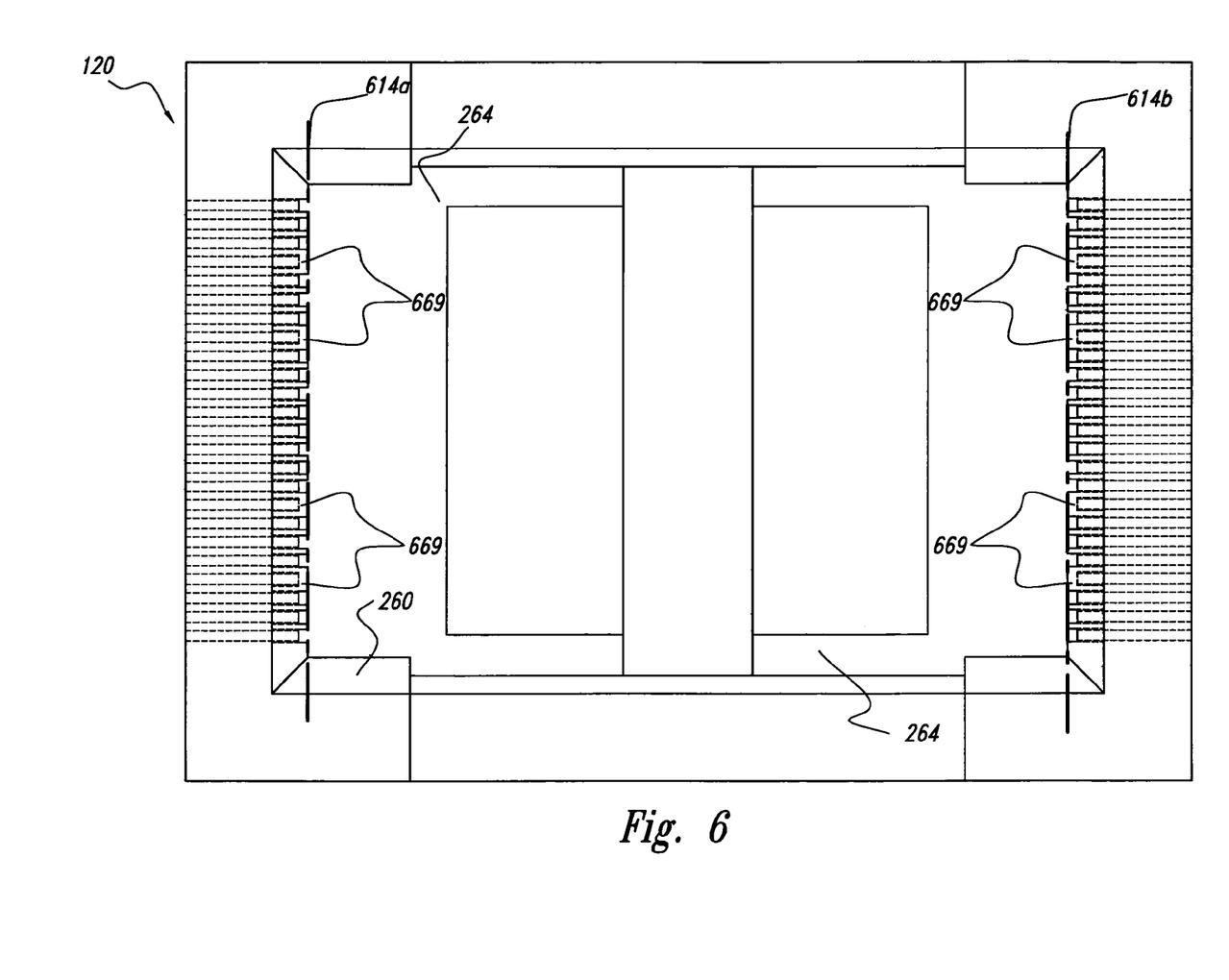
FIG. 6 is a top plan view of the apparatus of FIG. 2 having a different configuration of masked and unmasked electrical sockets.

In many embodiments, as few as two masked electrical sockets can form a guide zone. However, in other embodiments, more than two masked electrical sockets can form a guide zone. For example, FIG. 6 is a top plan view of the apparatus with eight masked electrical sockets and corresponding stop elements 669 forming separate guide zones 614a and 614b juxtaposed with the support surface 264 of the nest 260. In addition, in several embodiments, other arrangements of masked electrical sockets are possible. For example, four sets of masked electrical sockets (corresponding to four separate guide zones) can be aligned at each of the sides of a four-sided leadless chip carrier (LCC) package. Embodiments of the apparatus 120 can also be configured to engage a variety of microelectronic packages, including, for example, small outline packages, quad packages, leadless packages, and inline packages. In addition, although illustrated as engaging with gull-type peripheral leads, embodiments of the contacts and corresponding open contact compartments can also be configured to engage other types of leads, such as J-leads, C-bend leads, I-leads, bat-wing leads, and land-pad type leads.

Figure 7:
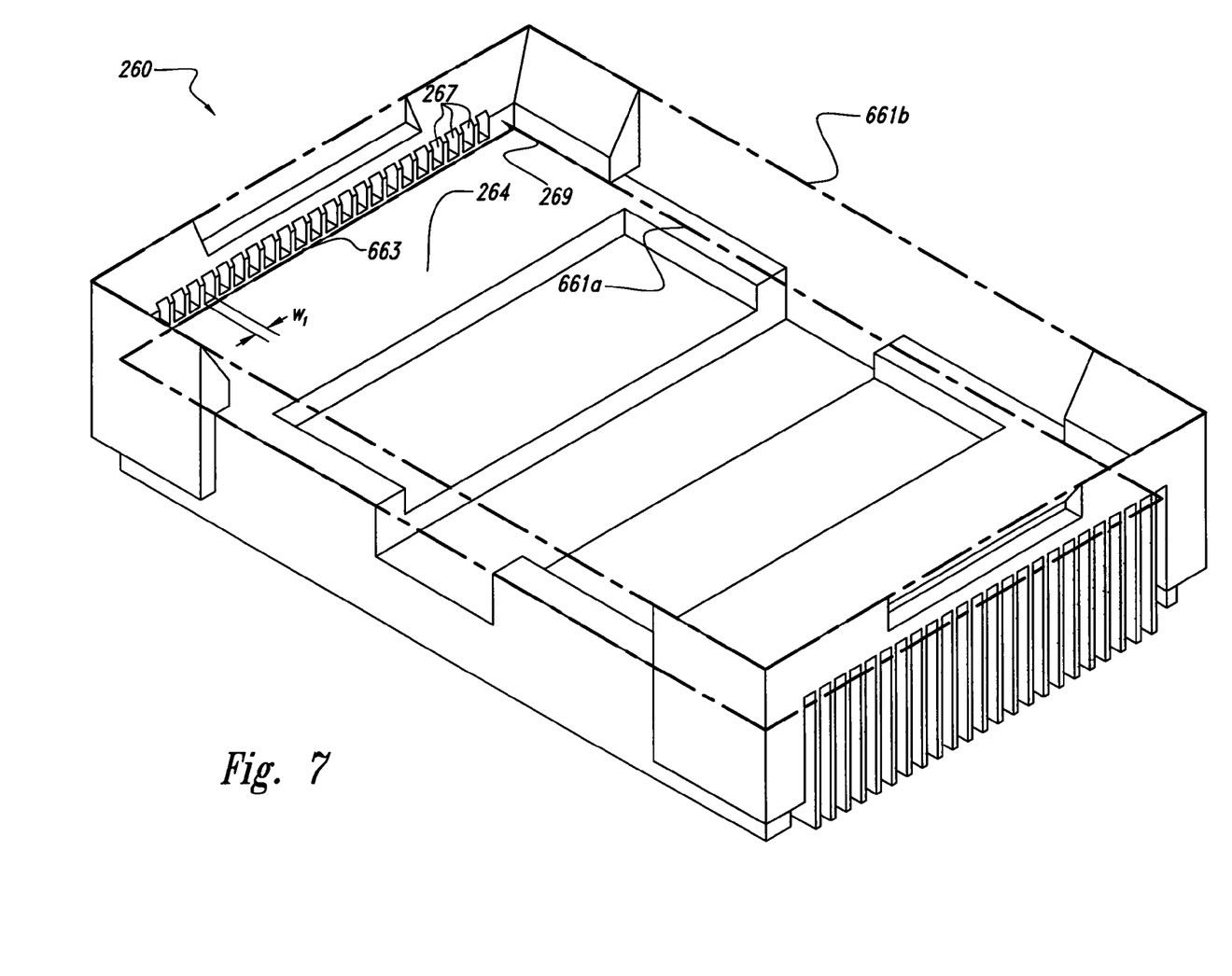
FIG. 7 is an isometric view of a nest employed in the apparatus of FIG. 2.

FIG. 7 is an isometric view of the nest 260 in more detail, showing an inner perimeter portion 661a (adjacent to the support surface 264) and an outer perimeter portion 661b. The inner perimeter portion 661a is generally sized to correspond with a footprint of a microelectronic component, and the outer perimeter portion 661b is generally sized so that the nest 260 securely fits within the actuator 250 (FIG. 2). The nest 260 also includes an edge portion 663 adjacent to the inner perimeter portion 661a and below individual socket openings 267. The edge portion 663 can inhibit the lateral motion of individual peripheral leads 112 (FIG. 1A) to prevent the leads from extending into the individual socket openings 267 when a microelectronic component is seated at the support surface 264. In many embodiments, the nest element 260 is fabricated as a single part. For example, the nest 260 can be formed from injected molded plastic. The relative locations of unmasked and masked electrical sockets can accordingly be designed into a specific mold. In several examples, the unmasked electrical sockets can be molded to have a socket opening with a width w1 that is wider than a width of a peripheral lead. For example, the width $w_1$ can be in a range of about 0.17 mm to about 0.27 mm. The masked electrical sockets, on the other hand, are molded so that they do not have such an opening. These masked sockets can have contact compartments that are generally similar in shape and size to contact compartments of the unmasked electrical sockets except that the masked sockets have stop elements in lieu of socket openings.

Figure 8:
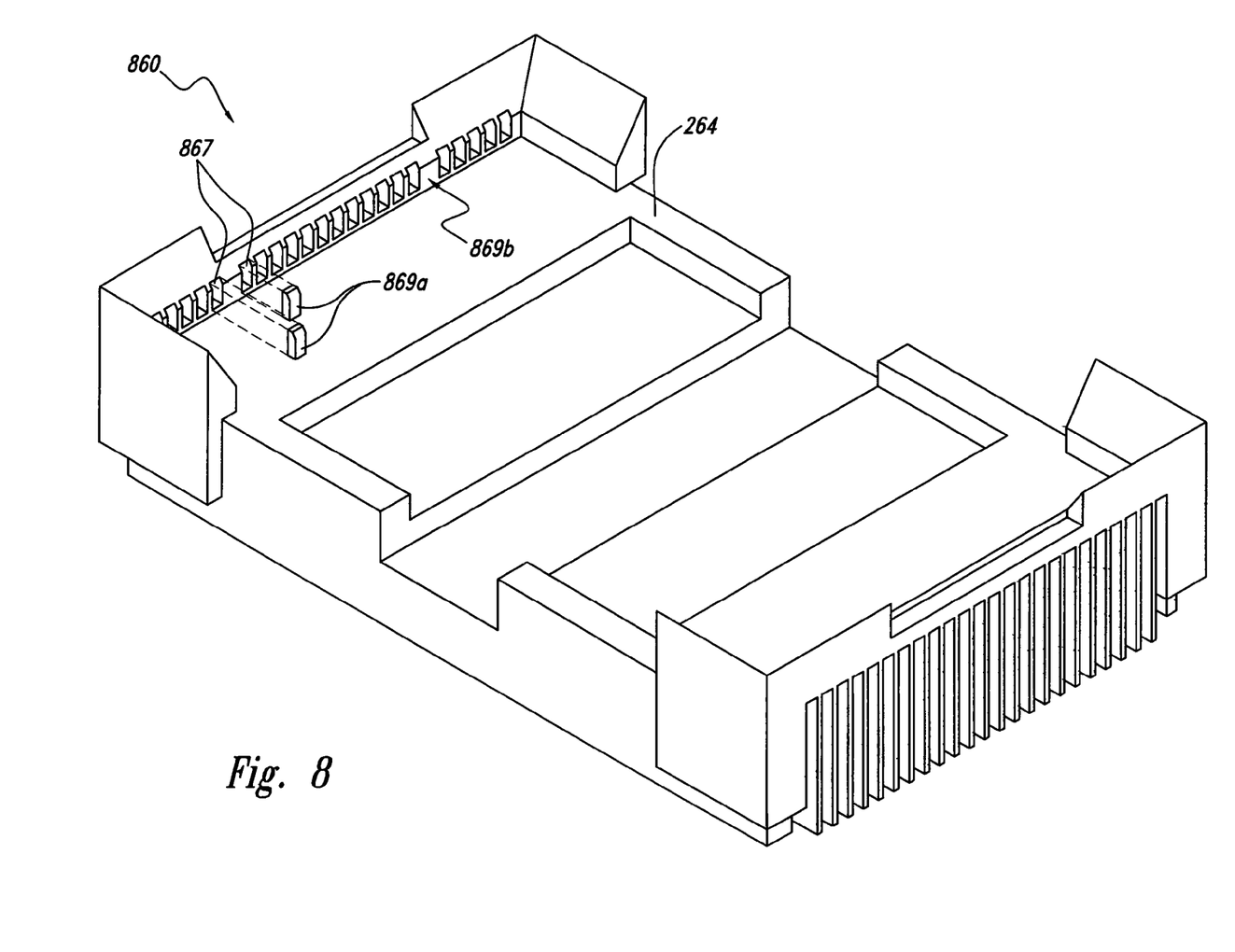
FIG. 8 is an isometric view of another embodiment of a nest having stop elements removed therefrom.

Although in many embodiments the stop element is a molded element, other embodiments of stop elements are possible. For example, a stop element can include a temporary plug that is inserted into an open contact compartment. Given, however, that the widths of the socket openings are generally on the order of tenths of millimeters, inserting and affixing such plugs can be difficult and requires good accuracy. Thus, it is expected that special tooling can be employed to install such plugs. Additionally or alternatively, such tooling could also be used to create socket openings (in lieu of installing plugs). For example, FIG. 8 is an isometric view of a nest 860 having stop elements 869a that have been removed (e.g., carved or "punched out") from the nest 860 to form socket openings 867. A mechanical stamping tool, for example, can mechanically punch or carve socket openings into contact compartments, leaving remaining stop elements 869b to serve as a guide zone. In several embodiments, a test engineer can use such a stamping tool to adapt a nest to a specific microelectronic component.

Embodiments of the apparatus 120 can also employ interchangeable nests having different arrangements of masked and unmasked electrical sockets. Generally, in many testing applications, circuit boards are hardwired to apply specific electrical potentials to contacts. For example, some of the electrical contacts of the sockets may be permanently connected to ground electrical potentials or supply electrical potentials. Because such ground or supply potentials typically correspond with the lead assignments of a microelectronic component, conventional test apparatus cannot readily accommodate a microelectronic component having a different assignment of leads. To test a component having different lead assignments, conventional testing apparatus need to be installed on another circuit board having a different hardwired configuration.

Figure 9A:
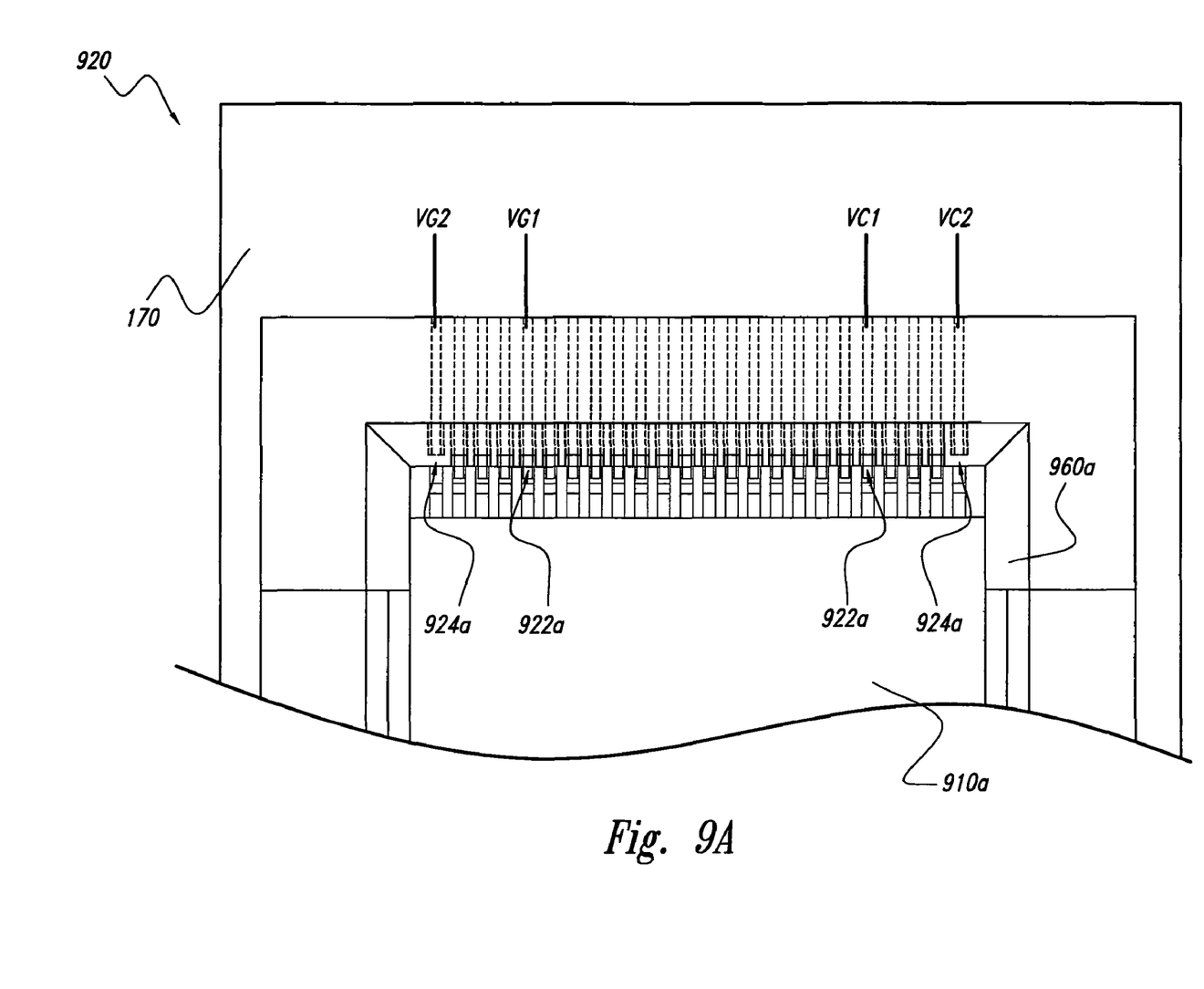
FIGS. 9A and 9B are top plan views of an apparatus having interchangeable nests.
Figure 9B:
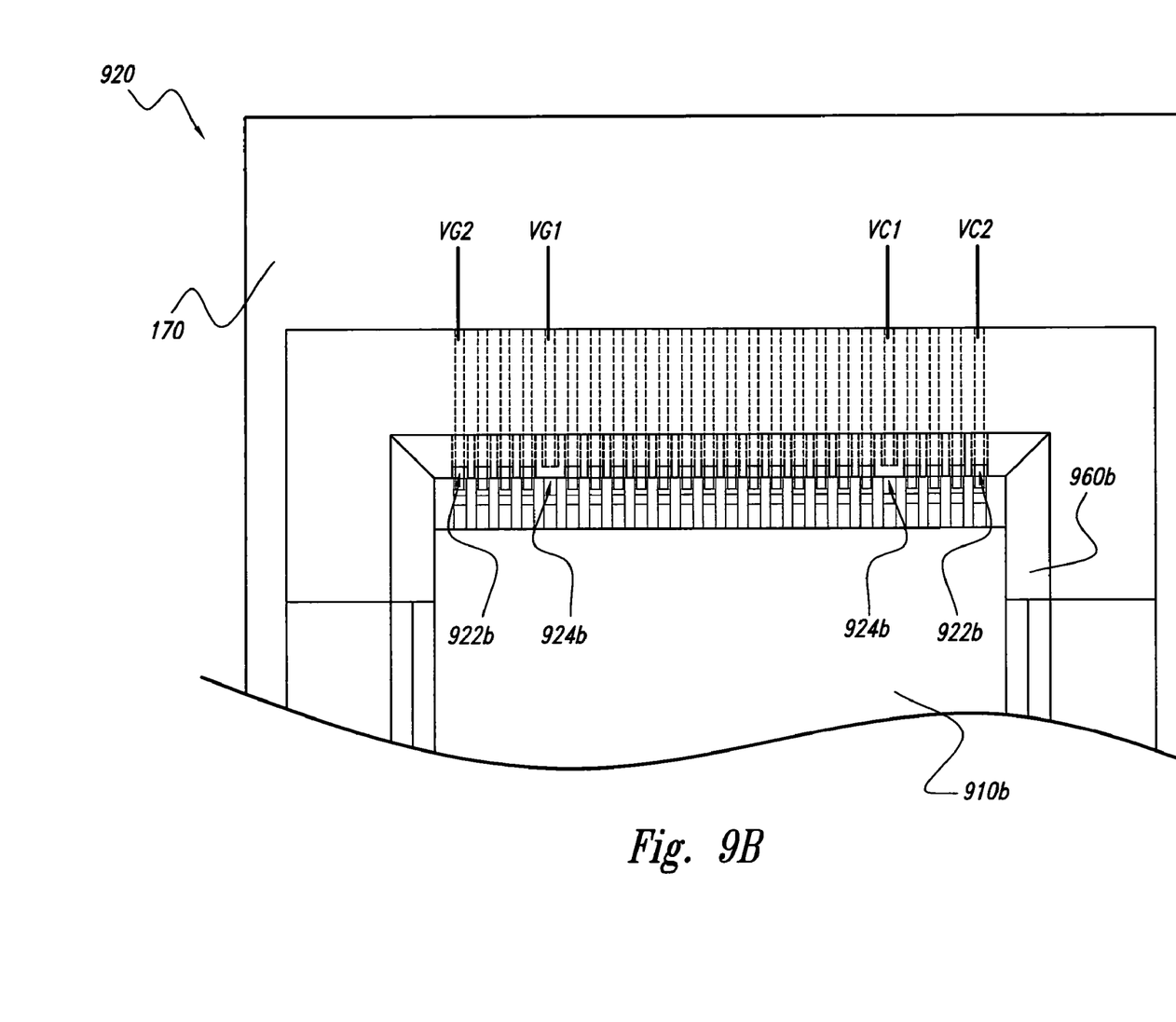

FIGS. 9A and 9B are partial top plan views of an apparatus 920 having interchangeable nests 960a (FIG. 9A) and 960b (FIG. 9B). Referring to FIG. 9A, a first microelectronic component 910a is seated at the nest 960a, and unmasked electrical sockets 922a electrically couple first supply VC1 and first ground VG1 potentials at the substrate 170 to the first microelectronic component 910a. Masked electrical sockets 924a, however, electrically isolate the first microelectronic component 910a from second supply VC2 and second ground VG2 potentials applied at the substrate 170. Referring now to FIG. 9B, the nest 960a has been replaced by the nest 960b, and a second microelectronic component 910b has been loaded into the nest 960b. The second microelectronic component 910b is electrically coupled to unmasked electrical sockets 922b, which electrically couple the second microelectronic 910b component to the second supply VC2 and second ground VG2 potentials at the substrate 170. The second microelectronic component 910b, however, is electrically isolated from the first supply VC1 and first ground VG1 potentials via masked electrical sockets 924b. Accordingly, the interchangeable nests 960a and 960b can be used to engage microelectronic components having different lead assignments without requiring any changes to a hardwired configuration. Further, in other embodiments, the apparatus 920 can employ additional interchangeable nests, such as nests having more or fewer masked electrical sockets, or no masked electrical sockets.

From the foregoing, it will be appreciated that specific embodiments have been described herein for purposes of illustration, but well-known structures and functions have not been shown or described in detail to avoid unnecessarily obscuring the description of the embodiments. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature or additional types of other features are not precluded.

It will also be appreciated that specific embodiments have been described herein for purposes of illustration but that various modifications may be made within the claimed subject matter. For example, embodiments of the base and nests may be employed in applications other than electrical testing. In several embodiments, for example, the base and nests can be employed within a consumer electronic part that carries a microelectronic component (e.g., a supporting element of a dual in-line package or other package). In addition, although shown as separate elements, the base and nest can be integrated into a single part. For example, a base and nest can be a formed as a single molded plastic part. Furthermore, many of the elements of one embodiment can be combined with other embodiments in addition to, or in lieu of, the elements of the other embodiments. Accordingly, the invention is not limited except as by the appended claims.

We claim:

1. An apparatus for forming a temporary electrical connection with peripheral leads of a microelectronic component, comprising:
    a base;
    a plurality of electrical contacts coupled to the base; and
    a nest movable with respect to the base, the nest having a support surface for carrying the microelectronic component, a plurality of open contact compartments aligned with the peripheral leads of the microelectronic component, and at least one closed contact compartment, wherein the plurality of electrical contacts are disengaged from the peripheral leads in a first position and a subset of the plurality of electrical contacts extend through the open contact compartments and engage the peripheral leads in a second position, and wherein at least one electrical contact is aligned with a closed contact compartment and prevented from electrically contacting a corresponding peripheral lead of the microelectronic component.

2. The apparatus of claim 1, further comprising an interposer substrate attached to the base, wherein the contacts are electrically coupled to a computer test station via the substrate.

3. The apparatus of claim 1, further comprising an interposer substrate attached to the base, wherein the microelectronic component comprises a first microelectronic component, and wherein the interposer substrate carries a second microelectronic component that is electrically coupled to the first microelectronic component via the substrate and the contacts.

4. The apparatus of claim 1 wherein the closed contact compartment includes a stop element interposed between the electrical contact and aligned with the closed compartment and the corresponding peripheral lead of the microelectronic component.

5. The apparatus of claim 1, further comprising an actuator operably coupled with the base, the actuator being configured to urge lateral portions of the individual contacts in a lateral direction and/or a vertical direction away from the peripheral leads of the microelectronic component.

6. An apparatus for forming an electrical connection with peripheral leads of a microelectronic component, comprising:
    a base;
    a plurality of electrical contacts coupled to the base;
    a nest having a support surface for carrying the microelectronic component; and
    a plurality of electrical sockets that are formed when the nest is attached to the base, the sockets being adjacent to a perimeter portion of the support member surface, aligned with the peripheral leads of the microelectronic component, and electrically and mechanically isolated from one another, wherein the plurality of sockets comprise a first socket and a second socket, the first socket having a first contact compartment and a first electrical contact at least partially disposed therein, wherein the first contact is adjustable to mechanically contact a first peripheral lead of the microelectronic component, and the second socket having a second contact compartment and a second electrical contact at least partially disposed therein, wherein the second contact compartment includes a stop element that prevents the second contact from mechanically contacting a second peripheral lead of the microelectronic component, wherein the nest comprises a first removable nest and the plurality sockets have a first configuration of contact compartments when the first removable nest is seated at the base, and wherein the plurality of sockets have a second configuration of contact compartments when a second removable nest is seated at the base, the second configuration being different than the first configuration.

7. A system of electrically intercoupled microelectronic components, comprising:

a nest member having a support surface and a plurality of contact compartments, the support surface carrying a first microelectronic component and being adjacent to the contact compartments, wherein individual contact compartments include an electrical contact at least partially disposed therein, and wherein the electrical contact is electrically coupled to a second microelectronic component;

individual first electrical contacts at least partially housed in unmasked contact compartments so that the first electrical contacts are disengaged when the nest is in a first position and the first electrical contacts are electrically coupled to individual first peripheral leads of the first microelectronic component when the nest is in a second position; and individual second electrical contacts at least partially housed in masked socket compartments and electrically isolated from individual second peripheral leads of the first microelectronic component in the second position.

8. The system of claim 7 wherein the first and second contacts are electrically coupled to the second microelectronic component via a printed circuit board.

9. The system of claim 7, further comprising a support base carrying the nest, the individual first contacts, and the individual second contacts.

10. The system of claim 7 wherein the masked socket compartments include a stop element between the individual first peripheral leads and the individual second contacts.

11. The system of claim 10 wherein individual stop elements form a guide zone for preventing the individual first peripheral leads from mechanically contacting the individual first contacts when the first microelectronic component is being seated at the support surface.

12. The system of claim 10 wherein individual stop elements form a guide zone for preventing the individual first peripheral leads from mechanically contacting the individual first contacts when the first microelectronic component is being removed from the support surface.

* * * * *